(12) United States Patent
Lu

(10) Patent No.: US 10,002,849 B2
(45) Date of Patent: Jun. 19, 2018

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/815,357

(22) Filed: Nov. 16, 2017

(65) Prior Publication Data

US 2018/0076177 A1    Mar. 15, 2018

Related U.S. Application Data

(62) Division of application No. 15/083,527, filed on Mar. 29, 2016, now Pat. No. 9,853,011.

(51) Int. Cl.
*H01L 21/44* (2006.01)
*H01L 21/48* (2006.01)
*H01L 21/50* (2006.01)
*H01L 25/065* (2006.01)
*H01L 23/00* (2006.01)
(Continued)

(52) U.S. Cl.
CPC ........ *H01L 25/0655* (2013.01); *H01L 21/568* (2013.01); *H01L 23/293* (2013.01); *H01L 23/3157* (2013.01); *H01L 23/49811* (2013.01); *H01L 23/49822* (2013.01); *H01L 23/49827* (2013.01); *H01L 23/49838* (2013.01); *H01L 23/564* (2013.01); *H01L 2225/06527* (2013.01);
(Continued)

(58) Field of Classification Search
CPC .. H01L 21/568; H01L 23/293; H01L 25/0655
USPC .......................................................... 438/106
See application file for complete search history.

(56) References Cited

U.S. PATENT DOCUMENTS 7,884,484 B2    2/2011    Yamano et al.
7,937,828 B2    5/2011    Yamano
(Continued)

OTHER PUBLICATIONS

Non-Final Office Action for U.S. Appl. No. 15/083,527, dated Apr. 13, 2017.
(Continued)

*Primary Examiner* — David S Blum
(74) *Attorney, Agent, or Firm* — Foley & Lardner LLP; Cliff Z. Liu

(57) ABSTRACT

A method for manufacturing a semiconductor package structure includes: (a) disposing at least one semiconductor element on a conductive structure, wherein the conductive structure includes at least one insulation layer and at least one circuit layer; (b) disposing an encapsulant on the conductive structure to cover the semiconductor element; (c) attaching a supporting structure on the conductive structure to surround the semiconductor element; and (d) disposing an upper element on the encapsulant, wherein a coefficient of thermal expansion of the upper element is in a range of variation less than or equal to about ±20% of a coefficient of thermal expansion of the circuit layer, and a bending modulus of the upper element is in a range of variation less than or equal to about ±35% of a bending modulus of the circuit layer.

20 Claims, 8 Drawing Sheets

(51) Int. Cl.
    *H01L 21/56*     (2006.01)
    *H01L 23/498*     (2006.01)
    *H01L 23/31*     (2006.01)
    *H01L 23/29*     (2006.01)

(52) U.S. Cl.
    CPC ............... *H01L 2225/06541* (2013.01); *H01L 2225/06555* (2013.01); *H01L 2225/06582* (2013.01)

(56) References Cited

U.S. PATENT DOCUMENTS

| | | |
|---|---|---|
| 9,159,635 B2 | 10/2015 | Elolampi et al. |
| 2009/0255709 A1 | 10/2009 | Fillion et al. |
| 2012/0161315 A1 | 6/2012 | Lin et al. |
| 2018/0033759 A1* | 2/2018 | Yang ...................... H01L 24/33 |

OTHER PUBLICATIONS

Notice of Allowance for U.S. Appl. No. 15/083,527, dated Aug. 16, 2017.

* cited by examiner

SEMICONDUCTOR PACKAGE STRUCTURE AND METHOD FOR MANUFACTURING THE SAME

CROSS-REFERENCE TO RELATED APPLICATION

This application is a divisional of U.S. patent application Ser. No. 15/083,527, Now U.S. Pat. No. 9,853,011, filed Mar. 29, 2016, the content of which is incorporated herein by reference in its entirety.

BACKGROUND

1. Field of the Disclosure

The present disclosure relates to a semiconductor package structure and a semiconductor process, and more particularly to a flexible semiconductor package structure and a method for manufacturing the same.

2. Description of the Related Art

A conventional semiconductor package structure includes a solid molding compound after being cured. Thus, the conventional semiconductor package structure is stiff. However, for flexible devices or for devices with curved surfaces (e.g., a wearable device or a flexible Light Emitting Diode (LED)), such stiff packaging may not be acceptable.

SUMMARY

In some embodiments according to one aspect, a method for manufacturing a semiconductor package structure includes: (a) disposing at least one semiconductor element on a conductive structure, wherein the conductive structure includes at least one insulation layer and at least one circuit layer; (b) disposing an encapsulant on the conductive structure to cover the semiconductor element; (c) attaching a supporting structure on the conductive structure to surround the semiconductor element; and (d) disposing an upper element on the encapsulant, wherein a coefficient of thermal expansion of the upper element is in a range of variation less than or equal to about ±20% of a coefficient of thermal expansion of the circuit layer, and a bending modulus of the upper element is in a range of variation less than or equal to about ±35% of a bending modulus of the circuit layer.

In some embodiments according to another aspect, a method for manufacturing a semiconductor package structure includes: (a) disposing at least one semiconductor element on a conductive structure, wherein the conductive structure includes at least one insulation layer and at least one circuit layer; (b) disposing an encapsulant on the conductive structure to cover the semiconductor element; (c) attaching a supporting structure on the conductive structure to surround the semiconductor element; and (d) disposing a metal layer on or in the encapsulant, wherein the metal layer is electrically insulated from the conductive structure.

DETAILED DESCRIPTION

The present disclosure provides an improved semiconductor package structure without a solid substrate or a leadframe, and improved techniques for manufacturing the semiconductor package structure. The semiconductor package structure and techniques of the present disclosure are suitable for incorporation into flexible devices or devices with curved surfaces.

A manufacturing process of making a wafer level semiconductor package structure may begin with bonding a plurality of dice to a conductive structure disposed on a surface of a wafer level substrate, followed by forming a molding material on the surface of the wafer level substrate to encapsulate the dice. After the molding material is solidified, the wafer level substrate can be removed by grinding to obtain a wafer level semiconductor package structure. In the wafer level semiconductor package structure, the dice are covered by the solid molding material, thus, the whole package structure is stiff.

Figure 1:
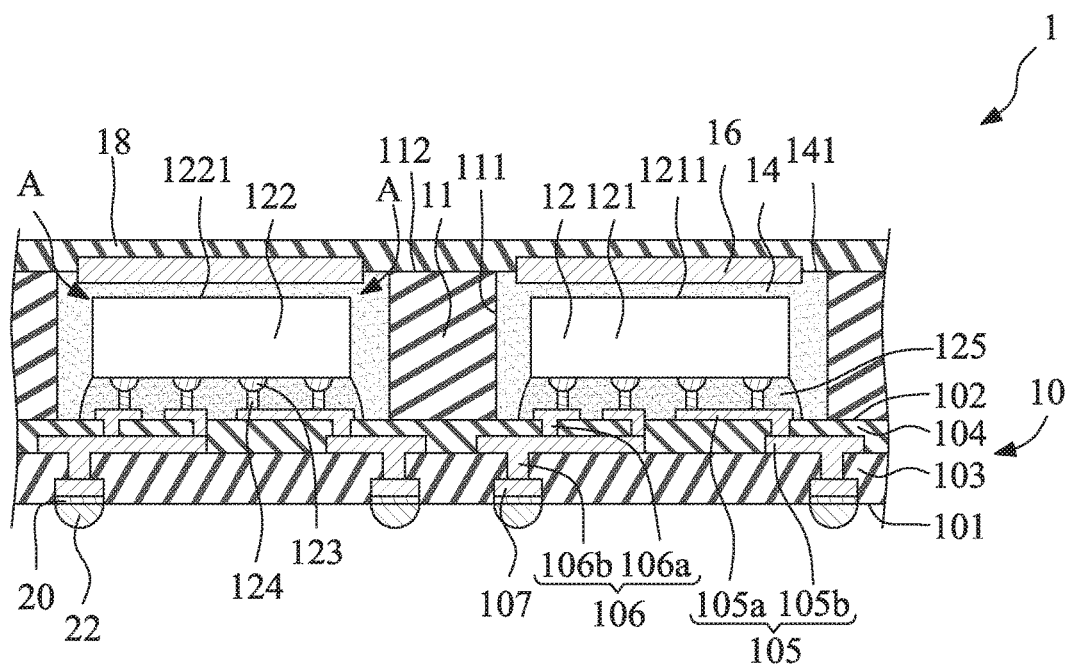
FIG. 1 illustrates a cross-sectional view of a semiconductor package structure according to an embodiment of the present disclosure.

FIG. 1 illustrates a cross-sectional view of a semiconductor package structure 1 according to an embodiment of the present disclosure. The semiconductor package structure 1 includes a conductive structure 10, a supporting structure 11, at least one semiconductor element 12 (e.g., semiconductor elements 121, 122), an encapsulant 14, at least one upper element 16, a protection layer 18, a surface finish layer 20 and at least one external connection element 22.

The conductive structure 10 has a first surface 101 and a second surface 102 opposite the first surface 101. In this embodiment, the conductive structure 10 includes a redistribution layer (RDL) that includes a first insulation layer 103, a second insulation layer 104, one or more circuit layers 105 (e.g., circuit layers 105a, 105b), interconnection vias 106 (e.g., interconnection vias 106a, 106b) and pads 107.

In one or more embodiments, the second insulation layer 104 is disposed on the first insulation layer 103. The material of the second insulation layer 104 may be same as or different from the material of the first insulation layer 103. Examples of materials that may be used for the first insulation layer 103 or the second insulation layer 104 include a solder mask, a photo-sensitive material, a polyimide, or other material or combination of materials. In one or more embodiments, the material of the first insulation layer 103 is a solder mask or a photo-sensitive material, and the material of the second insulation layer 104 is a polyimide or a photo-sensitive material.

In the embodiment of FIG. 1, there are two circuit layers 105 shown: the circuit layer 105a disposed on a surface of the second insulation layer 104, and the circuit layer 105b disposed on a surface of the first insulation layer 103 and embedded at a surface of the second insulation layer 104. In one or more embodiments, a line width/line space (L/S) of the circuit layer 105a is less than about 10 micrometers (μm)/about 10 μm. In one or more embodiments, the L/S of circuit layer 105b is also less than about 10 μm/about 10 μm. In embodiments in which the conductive structure 10 includes additional circuit layers 105, an uppermost circuit layer 105 (e.g., the farthest away from the first insulation layer 103, which may be disposed on the second surface 102 of the conductive structure 10) has an L/S less than about 10 μm/about 10 μm; and others of the circuit layers 105 may have similar L/S values.

In the embodiment illustrated in FIG. 1, there are two groups of interconnection vias 106: a group of interconnection vias 106a extending between the circuit layer 105a and the circuit layer 105b, and a group of interconnection vias 106b extending between the circuit layer 105b and the pads 107.

In one or more embodiments, the conductive structure 10 may include additional insulation layers and/or additional circuit layers 105 for additional routing options. For embodiments with additional circuit layers 105, additional groups of interconnection vias 106 may be included for connection between the circuit layers 105.

The pads 107 are embedded in the first insulation layer 103 and are exposed by the first surface 101 of the conductive structure 10. The surface finish layer 20 (e.g., an electroless nickel immersion gold (ENIG)) is plated on the pads 107. The external connection elements 22, such as solder balls or bumps, are disposed on the surface finish layer 20. The conductive structure 10 is flexible by design.

The semiconductor element(s) 12 are disposed on and electrically connected to the circuit layer 105a on the second surface 102 of the conductive structure 10. In the embodiment illustrated in FIG. 1, there are two semiconductor elements: the semiconductor element 121 and the semiconductor element 122, which are semiconductor dice. The semiconductor element 121 has an upper surface 1211 and the semiconductor element 122 has an upper surface 1221. The semiconductor elements 12 may be active elements or passive elements. A size and a function of the semiconductor element 121 may be the same as or different from a size and a function of the semiconductor element 122. In the embodiment illustrated in FIG. 1, the semiconductor elements 12 are electrically connected to the circuit layer 105a through bumps 123 and pillars 124. In other embodiments, the semiconductor elements 12 may be electrically connected to the circuit layer 105a by wire bonding. An underfill 125 surrounds the bumps 123 and the pillars 124 and fills under the semiconductor elements 12.

The supporting structure 11 is disposed on the second surface 102 of the conductive structure 10 and surrounds the semiconductor elements 12. The supporting structure 11 defines at least one through hole 111, and each of the semiconductor elements 12 is disposed in a corresponding one of the through holes 111. The supporting structure 11 has an upper surface 112, and the upper surface 112 of the supporting structure 11 is higher than the semiconductor elements 12 (e.g., the upper surface 112 of the supporting structure 11 is higher than the upper surface 1211 of the semiconductor element 121 and higher than the upper surface 1221 of the semiconductor element 122). The supporting structure 11 provides some stiffness for the semiconductor package structure 1. The material of the supporting structure 11 may be or may include, for example, a polymer with fiber glass, a Bismaleimide Triazine resin, an Ajinomoto build-up film (ABF), or polypropylene.

The encapsulant 14 is disposed in spaces defined by the through holes 111 of the supporting structure 11, filling the spaces and encapsulating the semiconductor elements 12 and the second surface 102 of the conductive structure 10. The encapsulant 14 has an upper surface 141, and in the embodiment illustrated in FIG. 1, the upper surface 141 of the encapsulant 14 is substantially coplanar with the upper surface 112 of the supporting structure 11. The encapsulant 14 is a material less rigid than the supporting structure 11. In one or more embodiments, the encapsulant material 14 is without or substantially without reinforcement, such as in the form of fibers or particle fillers, and where an amount of any reinforcement is less than about 5 wt. %, less than about 1 wt. %, or less than about 0.5 wt. % of the encapsulant material 14. In one or more embodiments, the encapsulant 14 has a bending modulus of greater than about 5000 megapascals (MPa), such as about 6000 MPa or greater or about 8000 MPa or greater. In one or more embodiments, the encapsulant 14 is, or includes, a solder mask (solder resist), a resin material without fiber glass (e.g., polyimide or liquid crystal polymer (LCP)), another unreinforced material, or a combination thereof. In one or more embodiments, the encapsulant material 14 consists or consists essentially of a polymeric material. The encapsulant 14 may be applied using any of a number of coating techniques, such as printing, spinning, spraying or slit coating.

The upper element(s) 16 are portions of a metal layer. In the embodiment illustrated in FIG. 1, the upper elements 16 are embedded in the encapsulant 14 at the upper surface 141 in the spaces defined by the through holes 111 of the supporting structure 11. In other embodiments, one or more of the upper elements 16 are disposed on (over) the upper surface 141 of the encapsulant 14. A coefficient of thermal expansion (CTE) of the upper element 16 is in a range of variation less than or equal to about ±20% or less than or equal to about ±15% of a CTE of the circuit layer 105, and a bending modulus of the upper element 16 is in a range of variation less than or equal to about ±35% or less than or equal to about ±30% of a bending modulus of the circuit layers 105 (e.g., 105a, 105b), to reduce warpage of the semiconductor package structure 1. In one or more embodiments, a material of the circuit layers 105 is copper, and a material of the upper element 16 is a metal such as copper, aluminum or gold. As shown in the embodiment of FIG. 1, each upper element 16 is disposed above a respective semiconductor element 12, such that the semiconductor element 12 is within (e.g., fully within) a projection area of the upper element 16 onto the second surface 102 of the conductive structure 10. The projection area of the upper element 16 is less than a cross-sectional area of the through hole 111 of the supporting structure 11.

The protection layer 18 is disposed on the upper elements 16, the upper surface 141 of the encapsulant 14, and the upper surface 112 of the supporting structure 11. The material of the protection layer 18 is a non-metal, such as a polyimide or an LCP, and protects the upper elements 16 from being etched during a manufacturing stage, and also avoids peeling of the upper element 16 from the encapsulant 14.

The conductive structure 10 of FIG. 1 is flexible by design. For example, the upper surface 112 of the supporting structure 11 is not much higher than the upper surfaces 1211, 1221 of the respective semiconductor devices 121, 122, and the circuit layer 105a is thin. Further, during manufacture, the supporting structure 11 restricts the flow of the encapsulant 14 as it is applied; thus, the encapsulant 14 need not include reinforcement (e.g., fiber), providing flexibility even after curing.

When the semiconductor package structure 1 is bent to a curved shape, a stress concentration can occur at the regions A that correspond to the corners of the semiconductor elements 12, which can result in a crack of a semiconductor package structure 1 and a delamination of the circuit layers 105, especially when the L/S of the circuit layer 105 is less than about 10 µm/about 10 µm. The upper elements 16 are included in the semiconductor package structure 1 to disperse the stress along a normal direction of the curve shape. Stresses sustained by the upper elements 16 will be distributed evenly to the supporting structure 11 and over the semiconductor package structure 1, so that cracks in the semiconductor package structure 1 and delamination of the circuit layers 105 can be reduced. Further, during manufacture, the CTE of the upper element 16 is close to the CTE of the circuit layer 105, so that warpage of the semiconductor package structure 1 during manufacture will be reduced.

Figure 2:
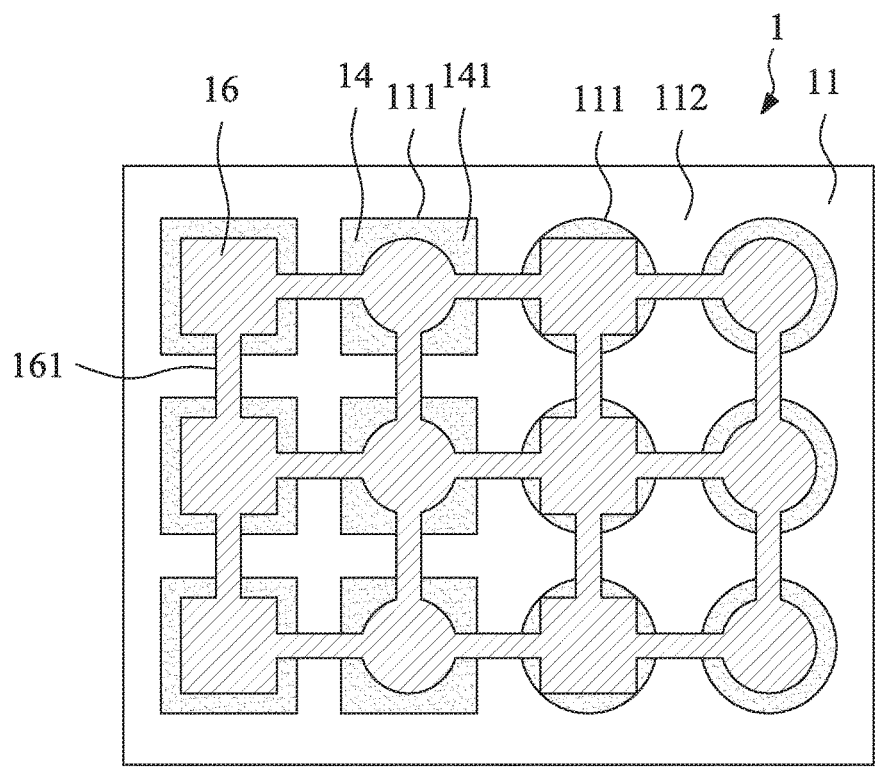
FIG. 2 illustrates a top view of the semiconductor package structure of FIG. 1 according to an embodiment of the present disclosure.

FIG. 2 illustrates a top view of the semiconductor package structure 1 according to an embodiment of the present disclosure, wherein the protection layer 18 is omitted from the view for purposes of discussion. A shape of the semiconductor package structure 1 is rectangular from the top view. The through holes 111 of the supporting structure 11 may be rectangular, square, circular, elliptical or other shape from the top view, and the upper elements 16 may be rectangular, square, circular, elliptical or other shape from the top view. As illustrated in FIG. 2, the shapes of the individual upper elements 16 may or may not match the shapes of the corresponding through holes 111, the shapes of different upper elements 16 may differ, and the shapes of different through holes 111 may differ. In one or more embodiments, such as the embodiment illustrated in FIG. 2, the upper elements 16 are connected to each other by connecting bars 161; in other embodiments, one or more of the connecting bars 161 are omitted.

Figure 3:
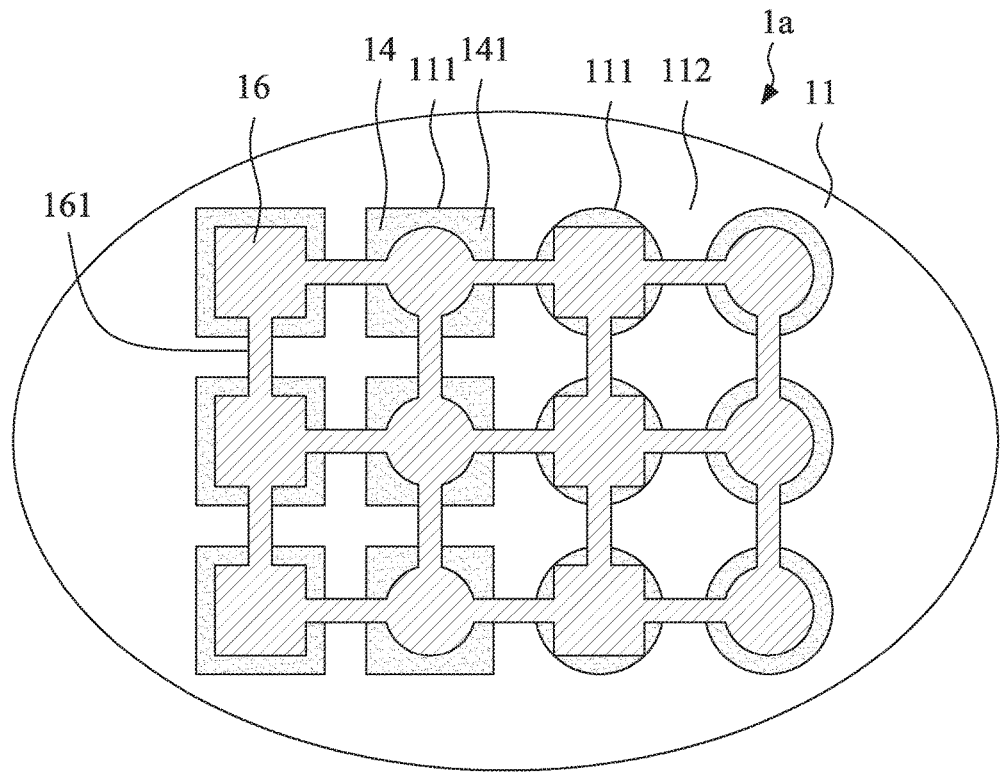
FIG. 3 illustrates a top view of a semiconductor package structure of FIG. 1 according to an embodiment of the present disclosure.

FIG. 3 illustrates a top view of a semiconductor package structure 1a according to an embodiment of the present disclosure. The semiconductor package structure 1a is similar to the semiconductor package structure 1 as shown in FIG. 2, except that the shape of the semiconductor package structure 1a is elliptical from the top view. It should be understood that "rectangular" is inclusive of square and "elliptical" is inclusive of circular, and that shapes other than rectangular or elliptical are encompassed by the present disclosure.

Figure 4:
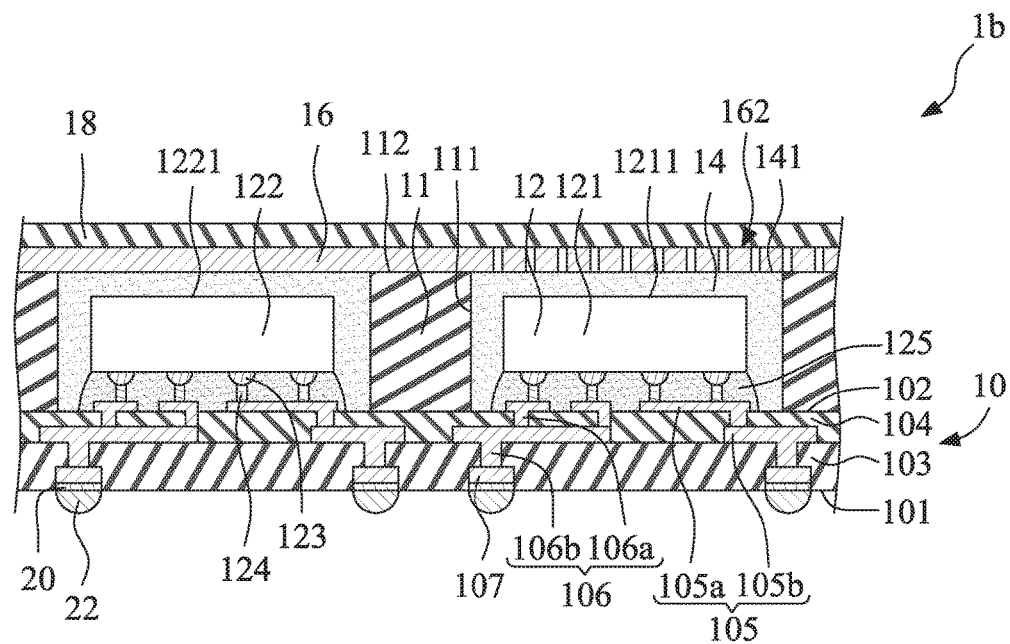
FIG. 4 illustrates a cross-sectional view of a semiconductor package structure according to an embodiment of the present disclosure.

FIG. 4 illustrates a cross-sectional view of a semiconductor package structure 1b according to an embodiment of the present disclosure. The semiconductor package structure 1b is similar to the semiconductor package structure 1 as shown in FIG. 1, differences being that the upper element 16 is disposed on the upper surface 141 of the encapsulant 14 and the upper surface 112 of the supporting structure 11, and the protection layer 18 is disposed on the upper element 16. In addition, the upper element 16 includes a mesh structure 162. In the embodiment of FIG. 4, a portion of the upper element 16 above the semiconductor element 122 is solid, and another portion of the upper element 16 above the semiconductor element 121 is the mesh structure 162.

Figure 5:
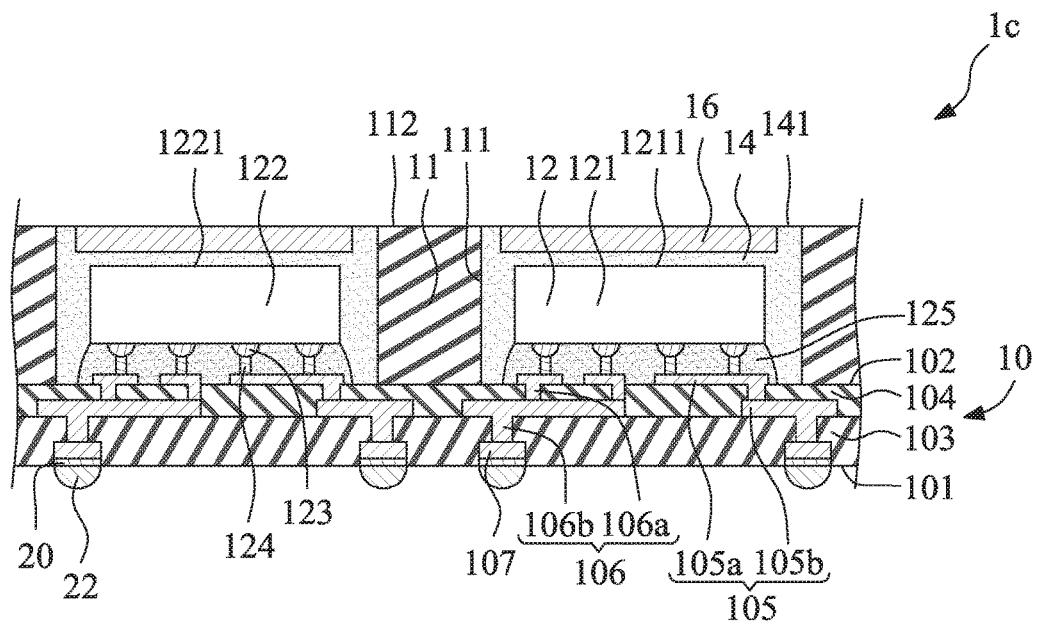
FIG. 5 illustrates a cross-sectional view of a semiconductor package structure according to an embodiment of the present disclosure.

FIG. 5 illustrates a cross-sectional view of a semiconductor package structure 1c according to an embodiment of the present disclosure. The semiconductor package structure 1c is similar to the semiconductor package structure 1 as shown in FIG. 1, a difference being that the protection layer 18 is omitted to increase a heat dissipation efficiency.

Figure 6:
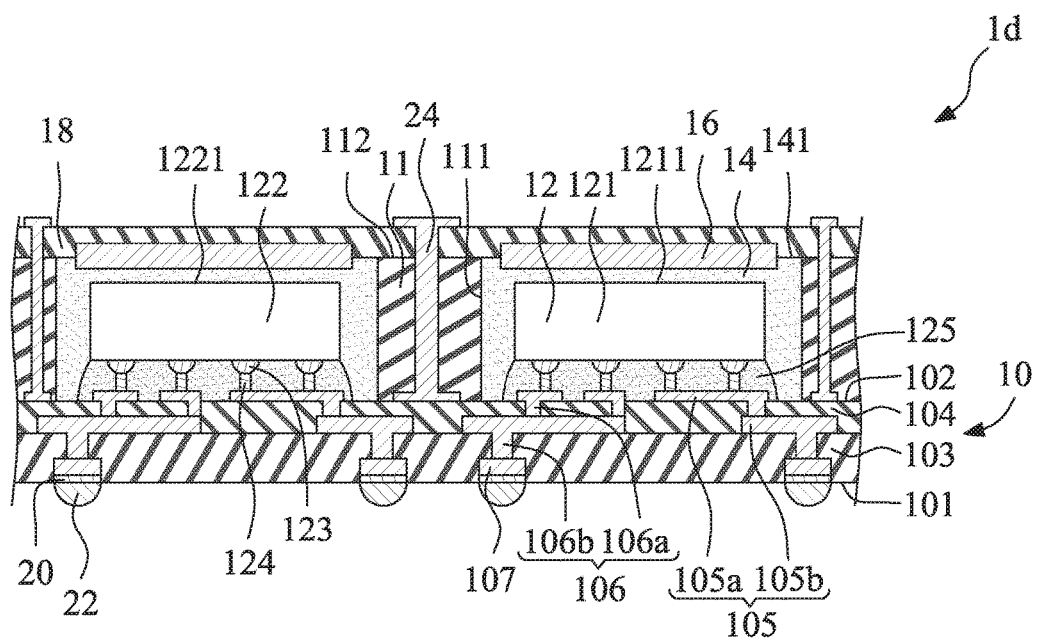
FIG. 6 illustrates a cross-sectional view of a semiconductor package structure according to an embodiment of the present disclosure.

FIG. 6 illustrates a cross-sectional view of a semiconductor package structure 1d according to an embodiment of the present disclosure. The semiconductor package structure 1d is similar to the semiconductor package structure 1 as shown in FIG. 1, a difference being that the semiconductor package structure 1d further includes at least one conductive via 24. As shown in FIG. 6, the conductive via 24 extends through the supporting structure 11 and the protection layer 18. In one or more embodiments, the conductive via 24 is electrically connected to a circuit layer 105 for electrical connection to an exterior of the semiconductor package structure 1d. In one or more embodiments, the conductive via 24 provides for thermal conduction to an exterior of the semiconductor package structure 1d.

Figure 7:
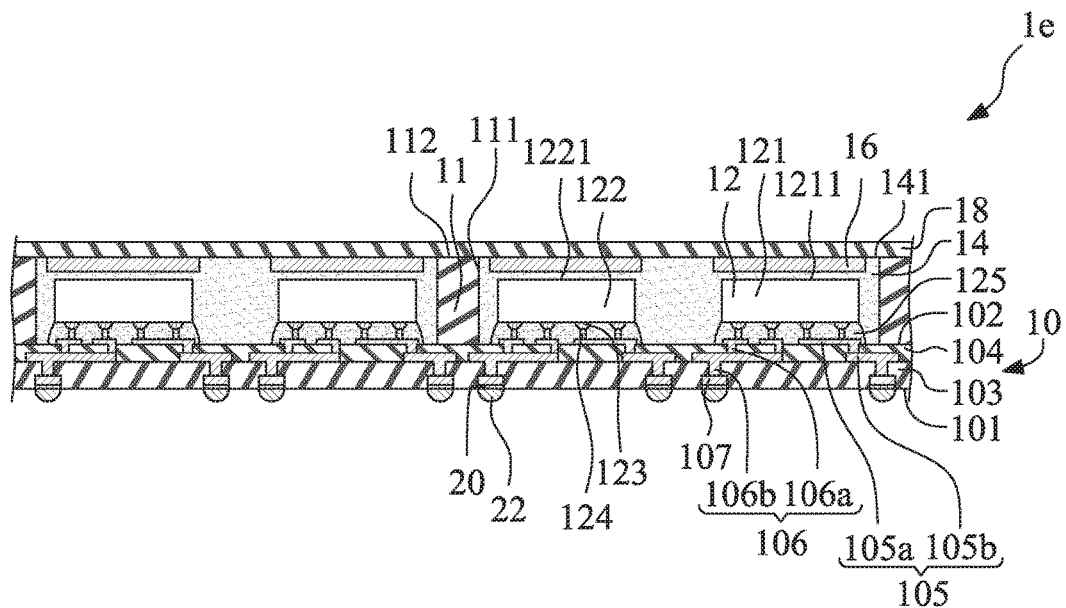
FIG. 7 illustrates a cross-sectional view of a semiconductor package structure according to an embodiment of the present disclosure.

FIG. 7 illustrates a cross-sectional view of a semiconductor package structure 1e according to an embodiment of the present disclosure. The semiconductor package structure 1e is similar to the semiconductor package structure 1 as shown in FIG. 1, a difference being that in the semiconductor package structure 1e, at least two semiconductor elements 12 are disposed in one through hole 111 of the supporting structure 11; that is, there is no supporting structure 11 between two semiconductor elements 12 in one through hole 111.

Figure 8:
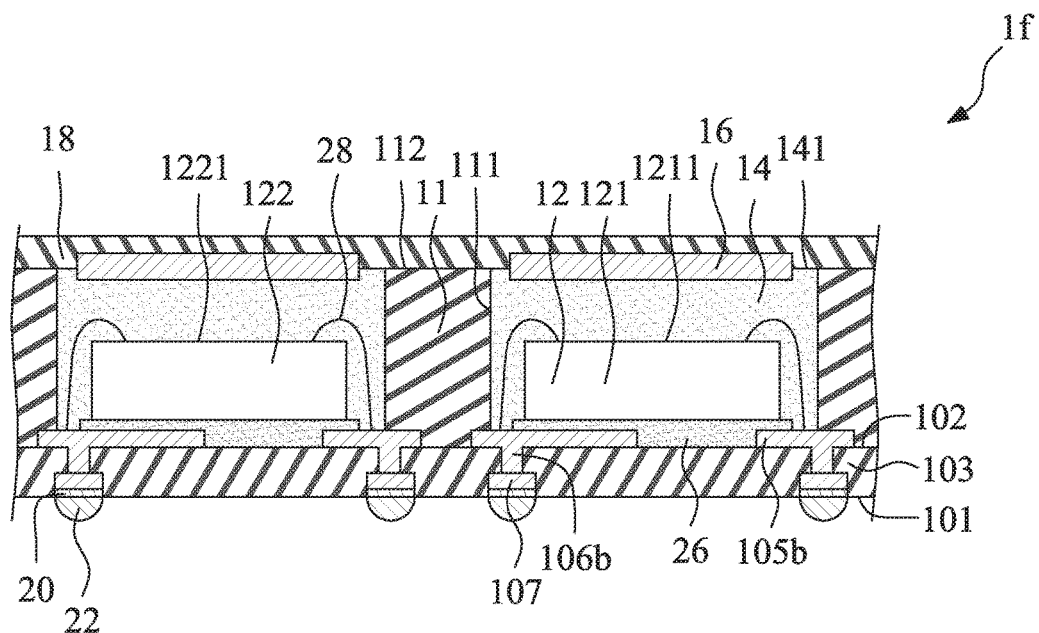
FIG. 8 illustrates a cross-sectional view of a semiconductor package structure according to an embodiment of the present disclosure.

FIG. 8 illustrates a cross-sectional view of a semiconductor package structure if according to an embodiment of the present disclosure. The semiconductor package structure if is similar to the semiconductor package structure 1 as shown in FIG. 1, differences being that the second insulation layer 104, the circuit layer 105a, and the interconnection vias 106a are omitted. Further differences include that the semiconductor elements 12 are adhered to the first insulation layer 103 by an adhesive 26, and the semiconductor elements 12 are electrically connected to the circuit layer 105b on the first insulation layer 103 by bonding wires 28.

Figure 9:
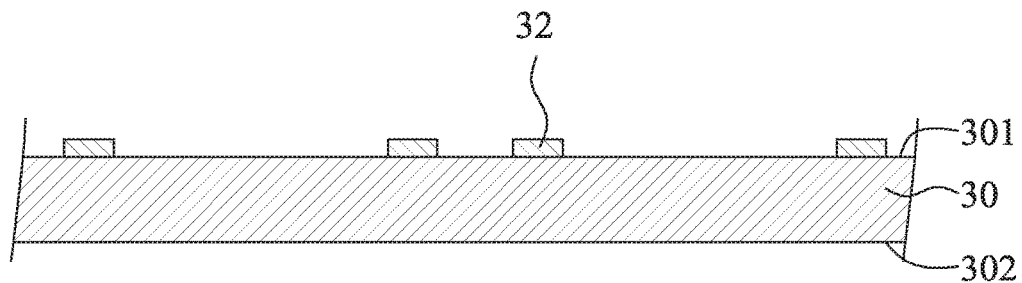
FIG. 9, FIG. 10, FIG. 11, FIG. 12, FIG. 13, FIG. 14, FIG. 15 and FIG. 16 illustrate a method for manufacturing a semiconductor package structure according to an embodiment of the present disclosure.

FIGS. 9-16 illustrate a method for manufacturing a semiconductor package structure according to an embodiment of the present disclosure. Referring to FIG. 9, a support carrier 30 is provided. The support carrier 30 has a first surface 301 and a second surface 302 opposite the first surface 301. In one or more embodiments, the material of the support carrier 30 is a metal such as copper. A patterned photoresist layer 32 is disposed on the first surface 301 of the support carrier 30. In one or more embodiments, the photoresist layer 32 is applied and then patterned using optical lithography. The support carrier 30 provides rigidity to reduce warpage during formation of an RDL structure on the carrier 30 (e.g., including the first insulation layer 103, the second insulation layer 104, the circuit layers 105, the interconnection vias 106 and the pads 107 of FIG. 1).

Figure 10:
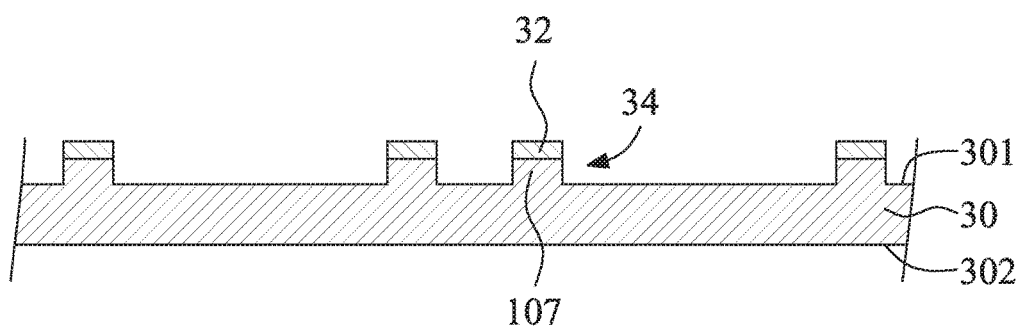

Referring to FIG. 10, a portion of the support carrier 30 that is not covered by the patterned photoresist layer 32 is removed (e.g., by etching) from the first surface 301 to form a patterned layer 34 that corresponds to the patterned photoresist layer 32. The patterned layer 34 includes pads 107 at locations corresponding to the pattern of the patterned photoresist layer 32. The patterned photoresist layer 32 is then removed.

Figure 11:
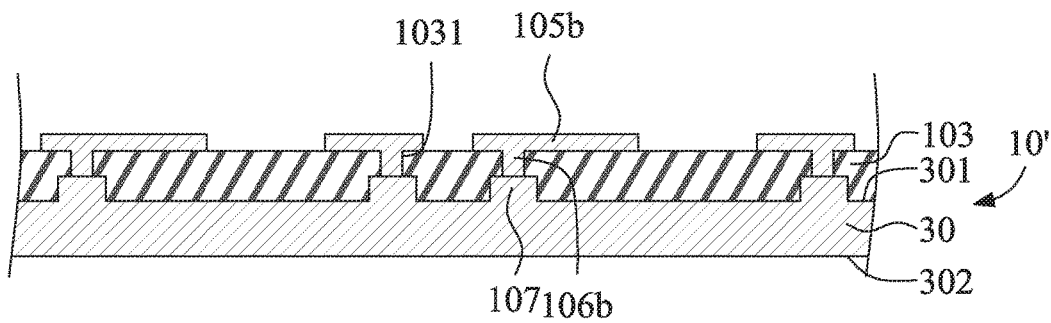

Referring to FIG. 11, a first insulation layer 103 is formed on the patterned layer 34 and the first surface 301 of the support carrier 30. In one or more embodiments, a material of the first insulation layer 103 is a solder mask or photosensitive material that is formed by printing. Openings 1031 are formed in the first insulation layer 103 to expose the pads 107. A metal, such as copper, is plated on the first insulation layer 103 and in the openings 1031. The metal on the first insulation layer 103 is patterned to form a circuit layer 105b. The metal in the openings 1031 form interconnection vias 106b that electrically connect the circuit layer 105b and the pads 107. The first insulation layer 103, the circuit layer 105b, the interconnection vias 106b and the pads 107 together form a conductive structure 10'.

Figure 12:
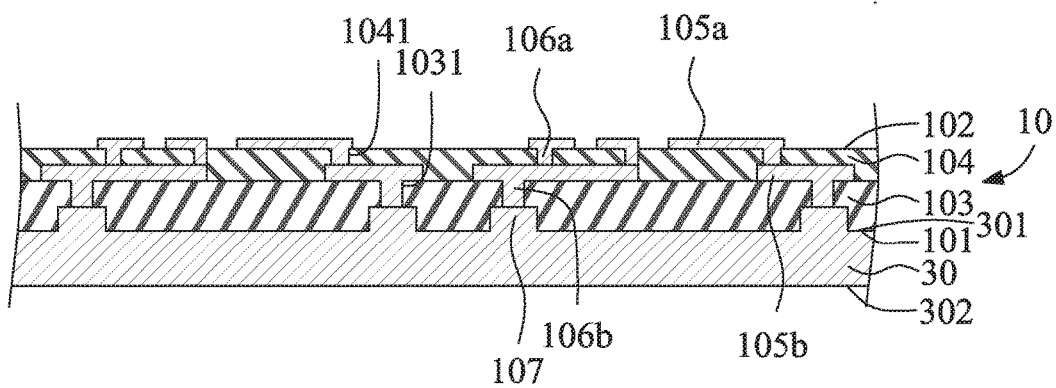

Referring to FIG. 12, a second insulation layer 104 is formed on the first insulation layer 103 and the circuit layer 105b. In one or more embodiments, a material of the second insulation layer 104 is a polyimide or a photosensitive material that is applied, for example, by spin coating or sputtering. Openings 1041 are formed in the second insulation layer 104 to expose a portion of the circuit layer 105b. A metal, such as copper, is plated on the second insulation layer 104 and in the openings 1041. The metal on the second insulation layer 104 is patterned to form a circuit layer 105a. The metal in the openings 1041 form the interconnection vias 106a that electrically connect the circuit layer 105a to the circuit layer 105b.

The first insulation layer 103, the second insulation layer 104, the circuit layers 105a, 105b, the interconnection vias 106a, 106b and the pads 107 together form a conductive structure 10. In one or more embodiments, the conductive structure 10 omits the second insulation layer 104, the circuit layer 105a and the interconnection vias 106a (e.g., the manufacturing stages represented by FIG. 12 are omitted; see FIG. 8). In one or more embodiments, additional insulation layers, circuit layers and interconnection vias are included in the conductive structure 10.

As can be seen in FIG. 12, the conductive structure 10 is disposed on the first surface 301 of the support carrier 30. The conductive structure 10 has a first surface 101 and a second surface 102 opposite the first surface 101.

Figure 13:
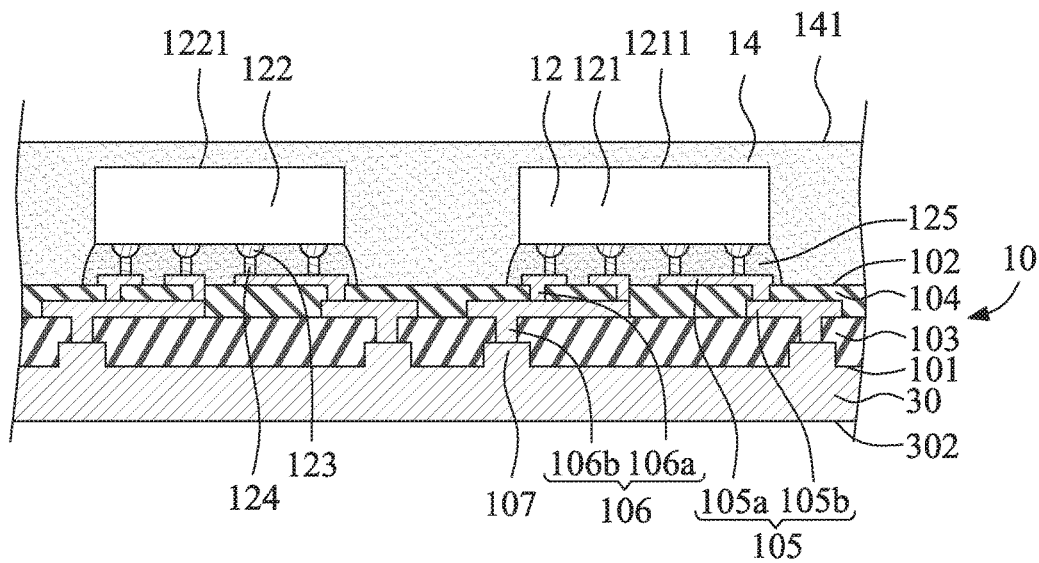

Referring to FIG. 13, at least one semiconductor element 12 is disposed on the conductive structure 10. In the embodiment illustrated, two semiconductor elements 12 (a semiconductor element 121 and a semiconductor element 122) are disposed on and electrically connected to the circuit layer 105a on the second surface 102 of the conductive structure 10 by flip chip bonding technology. The semiconductor elements 12 are connected to the circuit layer 105a through bumps 123 and pillars 124. It should be understood that flip chip bonding connections other than the bumps 123 and the pillars 124 are within the scope of the present disclosure. In one or more embodiments, one or more of the semiconductor elements 12 may be electrically connected to the circuit layer 105 by wire bonding.

An underfill 125 is optionally applied to surround the bumps 123 and the pillars 124 and to fill under the semiconductor elements 12.

An encapsulant 14 is formed or applied to cover and encapsulate the semiconductor elements 12 and the second surface 102 of the conductive structure 10. The encapsulant 14 may be a material without, or substantially without, reinforcing components (e.g., fiber), such as a solder mask (solder resist) or a resin material (e.g., ABF, polyimide, LCP or epoxy). The encapsulant 14 is applied in a liquid state and is subsequently cured, and the encapsulant 14 may be applied using any of a number of techniques, such as printing, spinning, spraying or slit coating.

Figure 14:
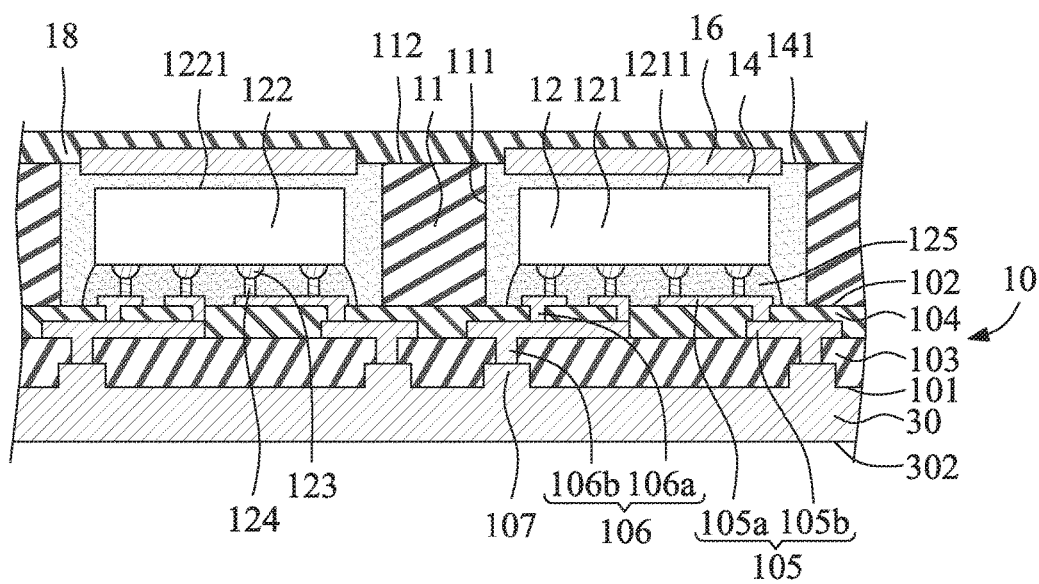

Referring to FIG. 14, a supporting structure 11 is pushed through the encapsulant 14 and is attached on the conductive structure 10. In the embodiment illustrated, the supporting structure 11 is disposed or adhered on the second surface 102 of the conductive structure 10. The supporting structure 11 defines at least one through hole 111. In the embodiment illustrated, each of the semiconductor elements 12 is disposed in a corresponding one of the through holes 111; in other embodiments, more than one semiconductor element 12 may be disposed in a single through hole 111.

The supporting structure 11 has an upper surface 112, and the upper surface 112 of the supporting structure 11 is higher than an upper surface 1211 of the semiconductor 121 and an upper surface 1221 of the semiconductor element 122. The supporting structure 11 provides some stiffness. In one or more embodiments, the supporting structure 11 is a solid structure except where the through holes 111 are defined. In other embodiments, the supporting structure further defines voids, gaps, or additional through holes. In one or more embodiments, a material of the supporting structure 11 is ABF or polypropylene. The encapsulant 14 fills the through holes 111 of the supporting structure 11 and is bounded horizontally (in the orientation shown) by the supporting structure 11.

Upper elements 16 are disposed on or embedded into the encapsulant 14. In one or more embodiments, the upper elements 16 are formed as a patterned metal layer; in other embodiments, the upper elements 16 are prefabricated, such as prefabricated metal components, which may be connected to form a patterned metal layer. In one or more embodiments, several upper elements 16 are connected together (e.g., by connecting bars, such as the connecting bars 161 of FIGS. 2 and 3). In embodiments in which the upper elements are connected by connecting bars (e.g., as illustrated in FIGS. 2 and 3), the supporting structure 11 can prevent the upper elements 16 from contacting the semiconductor elements 12.

A CTE of the upper element 16 is in a range of variation less than or equal to about ±20% of a CTE of the circuit layer 105, and a bending modulus of the upper element 16 is in a range of variation less than or equal to about ±35% of a bending modulus of the circuit layer 105. In one or more embodiments, a material of the upper element 16 is a metal such as copper, aluminum or gold.

In the embodiment illustrated in FIG. 14, the upper element 16 is embedded in the encapsulant 14 disposed within the through hole 111 of the supporting structure 11, and the upper element 16 is disposed above the semiconductor element 12. Each upper element 16 is disposed above a respective semiconductor element 12, such that the semiconductor element 12 is within a projection area of the upper element 16 onto the second surface 102 of the conductive structure 10. The projection area of the upper element 16 is less than a cross-sectional area of the through hole 111 of the supporting structure 11.

A protection layer 18 is disposed on the upper elements 16, a upper surface 141 of the encapsulant 14, and the upper surface 112 of the supporting structure 11. In one or more embodiments, a material of the protection layer 18 is a non-metal, such as polyimide or LCP, which can protect the upper elements 16 (or the metal layer including the upper elements 16) from being etched during subsequent manufacturing stages, and also to avoid the upper elements 16 (or the metal layer) from peeling from the encapsulant 14.

Figure 15:
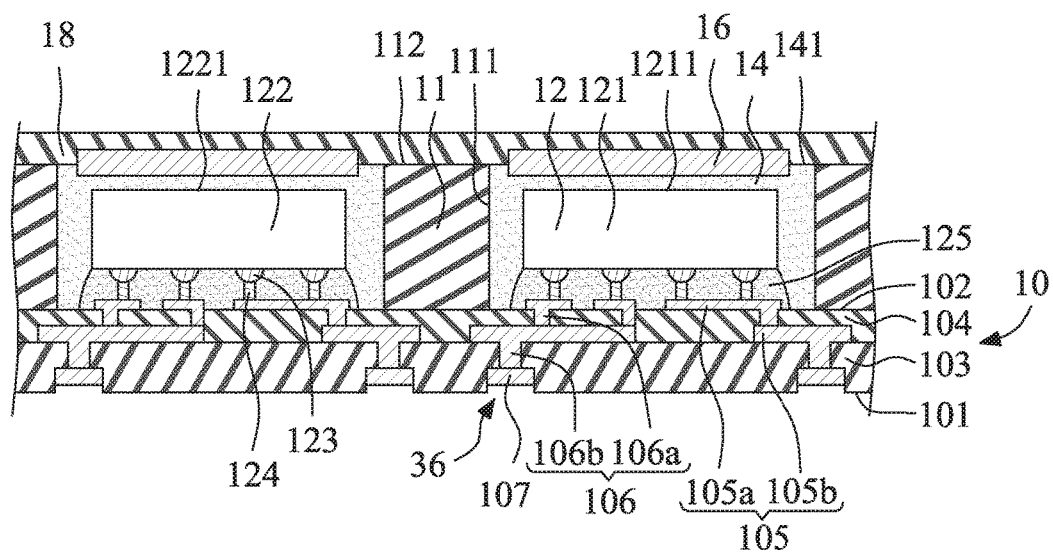

Referring to FIG. 15, a bottom portion of the support carrier 30 is removed (e.g., by etching). In the embodiment illustrated, the bottom portion of the support carrier 30 is removed to expose the first surface 101 of the conductive structure 10 and the pads 107. In one or more embodiments, the pads 107 are further etched to form recess portions 36 corresponding to the pads 107.

Figure 16:
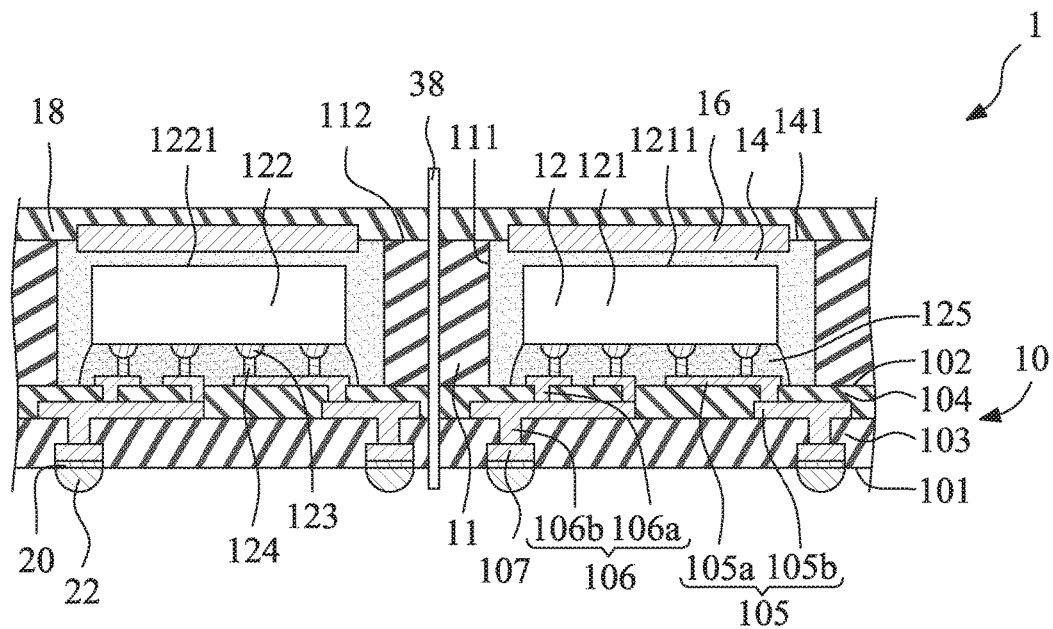

Referring to FIG. 16, a surface finish layer 20 (e.g., ENIG) is plated on the pads 107. External connection elements 22 (e.g., solder balls or bumps) are disposed on the surface finish layer 20 for external connection. Following the stage illustrated in FIG. 16, the semiconductor package structure 1 as shown in FIG. 1 is obtained. Optionally, a cutting tool 38, such as a blade, can be used to cut the semiconductor package structure 1.

Optionally, during or subsequent to one of the manufacturing stages illustrated in FIGS. 12-16, the encapsulant 14 may be dried or otherwise cured.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   (a) disposing at least one semiconductor element on a conductive structure, wherein the conductive structure includes at least one insulation layer and at least one circuit layer;
   (b) disposing an encapsulant on the conductive structure to cover the semiconductor element;
   (c) attaching a supporting structure on the conductive structure to surround the semiconductor element; and
   (d) disposing an upper element on the encapsulant, wherein a coefficient of thermal expansion of the upper element is in a range of variation less than or equal to ±20% of a coefficient of thermal expansion of the circuit layer, and a bending modulus of the upper element is in a range of variation less than or equal to ±35% of a bending modulus of the circuit layer.

2. The method according to claim 1, wherein (a) includes:
   (a1) providing a support carrier with the conductive structure disposed on a surface of the support carrier; and
   (a2) disposing the semiconductor element on the conductive structure;
   wherein after (d), the method further comprises:
   (e) removing a bottom portion of the support carrier to expose the conductive structure.

3. The method according to claim 2, wherein (a1) includes:
   (a1i) providing the support carrier having a first surface and a second surface opposite the first surface;
   (a1ii) removing a portion of the support carrier from the first surface to form a patterned layer comprising a plurality of pads; and
   (a1iii) forming the insulation layer and the circuit layer on the patterned layer and the first surface of the support carrier, so as to form the conductive structure;
   wherein in (e), the pads are exposed.

4. The method according to claim 2, wherein a material of the support carrier is metal.

5. The method according to claim 1, wherein in (b), the encapsulant is disposed by printing, spinning, spraying or slit coating.

6. The method according to claim 1, wherein in (c), the supporting structure is pushed through the encapsulant.

7. The method according to claim 1, wherein in (c), the supporting structure defines at least one through hole, and the semiconductor element is disposed in the through hole.

8. The method according to claim 1, wherein in (c), an upper surface of the supporting structure is higher than an upper surface of the semiconductor element.

9. The method according to claim 1, wherein in (c), an upper surface of the supporting structure is substantially coplanar with an upper surface of the encapsulant.

10. The method according to claim 1, further comprising disposing a protection layer on the upper element.

11. A method for manufacturing a semiconductor package structure, comprising:
  (a) disposing at least one semiconductor element on a conductive structure, wherein the conductive structure includes at least one insulation layer and at least one circuit layer;
  (b) disposing an encapsulant on the conductive structure to cover the semiconductor element;
  (c) attaching a supporting structure on the conductive structure to surround the semiconductor element; and
  (d) disposing a metal layer on or in the encapsulant, wherein the metal layer is electrically insulated from the conductive structure.

12. The method according to claim 11, wherein (a) includes:
  (a1) providing a support carrier with the conductive structure disposed on a surface of the support carrier; and
  (a2) disposing the semiconductor element on the conductive structure;
  wherein after (d), the method further comprises:
    (e) removing a bottom portion of the support carrier to expose the conductive structure.

13. The method according to claim 12, wherein (a1) includes:
  (a1i) providing the support carrier having a first surface and a second surface opposite the first surface;
  (a1ii) removing a portion of the support carrier from the first surface to form a patterned layer comprising a plurality of pads; and
  (a1iii) forming the insulation layer and the circuit layer on the patterned layer and the first surface of the support carrier, so as to form the conductive structure;
  wherein in (e), the pads are exposed.

14. The method according to claim 12, wherein a material of the support carrier is metal.

15. The method according to claim 11, wherein in (b), the encapsulant is disposed by printing, spinning, spraying or slit coating.

16. The method according to claim 11, wherein in (c), the supporting structure is pushed through the encapsulant.

17. The method according to claim 11, wherein in (c), the supporting structure defines at least one through hole, and the semiconductor element is disposed in the through hole.

18. The method according to claim 11, wherein in (c), an upper surface of the supporting structure is higher than an upper surface of the semiconductor element.

19. The method according to claim 11, wherein in (c), an upper surface of the supporting structure is substantially coplanar with an upper surface of the encapsulant.

20. The method according to claim 11, further comprising disposing a protection layer on the encapsulant and the metal layer.

* * * * *